(12) United States Patent
Gardes et al.

(10) Patent No.: US 12,413,049 B2
(45) Date of Patent: Sep. 9, 2025

(54) OPTOELECTRONIC SEMICONDUCTOR DEVICE

(71) Applicants: UNIVERSITY OF SOUTHAMPTON, Hampshire (GB); UNIVERSITY COLLEGE LONDON, London (GB)

(72) Inventors: Frederic Gardes, Southampton (GB); Alwyn John Seeds, London (GB); Huiyun Liu, London (GB); Siming Chen, London (GB)

(73) Assignees: UNIVERSITY OF SOUTHAMPTON (GB); UNIVERSITY COLLEGE LONDON (GB)

( * ) Notice: Subject to any disclaimer, the term of this patent is extended or adjusted under 35 U.S.C. 154(b) by 899 days.

(21) Appl. No.: 17/629,897

(22) PCT Filed: Jul. 27, 2020

(86) PCT No.: PCT/EP2020/071128
§ 371 (c)(1),
(2) Date: Jan. 25, 2022

(87) PCT Pub. No.: WO2021/018832
PCT Pub. Date: Feb. 4, 2021

(65) Prior Publication Data
US 2022/0255297 A1    Aug. 11, 2022

(30) Foreign Application Priority Data
Jul. 26, 2019   (GB) ...................................... 1910749

(51) Int. Cl.
*H01S 5/343*    (2006.01)
*G02B 6/12*     (2006.01)
(Continued)

(52) U.S. Cl.
CPC .......... *H01S 5/343* (2013.01); *G02B 6/12004* (2013.01); *G02B 6/131* (2013.01);
(Continued)

(58) Field of Classification Search
CPC .......... H01S 5/343; H01S 5/342; H01S 5/026; H01S 5/021; G02B 6/12004; G02B 6/131
See application file for complete search history.

(56) References Cited

U.S. PATENT DOCUMENTS 9,343,874 B2    5/2016    Liu et al.
9,401,404 B2    7/2016    Liu et al.
(Continued)

FOREIGN PATENT DOCUMENTS

CN    104701729 A    6/2015
CN    105088181      11/2015
(Continued)

OTHER PUBLICATIONS

Mounier, Eric et al., Silicon Photonics 2018 Report, Yole Developpment, Jan. 2018, 43 pages.
(Continued)

*Primary Examiner* — Tina Wong
(74) *Attorney, Agent, or Firm* — Quarles & Brady LLP

(57) ABSTRACT

A semiconductor device for use in an optoelectronic integrated circuit; the device comprising: a group four substrate, a waveguide, and a group III/V multilayer stack; wherein the group III/V multilayer stack comprises a quantum component for producing light for the waveguide; wherein the waveguide comprises a material with a deposition temperature below 550 degrees Celsius and a refractive index of any value between 1.3 and 3.8.

17 Claims, 6 Drawing Sheets

(51) Int. Cl.
*G02B 6/13* (2006.01)
*H01S 5/02* (2006.01)
*H01S 5/026* (2006.01)
*H01S 5/34* (2006.01)

(52) U.S. Cl.
CPC .............. *H01S 5/021* (2013.01); *H01S 5/026* (2013.01); *H01S 5/341* (2013.01); *G02B 2006/12061* (2013.01)

(56) References Cited

U.S. PATENT DOCUMENTS

| | | | |
|---|---|---|---|
| 9,960,567 | B2 | 5/2018 | Kim |
| 2002/0134671 | A1 | 9/2002 | Demaray et al. |
| 2003/0176002 | A1 | 9/2003 | Zhang et al. |
| 2013/0051727 | A1* | 2/2013 | Mizrahi ............. G02B 6/12 385/28 |
| 2013/0153533 | A1 | 6/2013 | Park et al. |
| 2015/0227041 | A1 | 8/2015 | Shukla et al. |
| 2015/0293302 | A1* | 10/2015 | Czornomaz ......... H10F 39/1892 438/31 |
| 2016/0087160 | A1 | 3/2016 | Cheng et al. |
| 2017/0098922 | A1 | 4/2017 | Hatori et al. |
| 2018/0261978 | A1 | 9/2018 | Kurczveil et al. |
| 2019/0227234 | A1 | 7/2019 | Ring et al. |
| 2020/0266610 | A1* | 8/2020 | Aho ..................... H01L 21/0245 |

FOREIGN PATENT DOCUMENTS

| | | |
|---|---|---|
| WO | WO-2012/114074 A1 | 8/2012 |
| WO | WO-2014/020329 A1 | 2/2014 |
| WO | WO-2017/139350 A1 | 8/2017 |
| WO | WO-2017/210300 A1 | 12/2017 |
| WO | WO-2018/104741 A1 | 6/2018 |
| WO | WO-2018/138531 A1 | 8/2018 |

OTHER PUBLICATIONS

International Search Report and Written Opinion, International Application No. PCT/EP2020/071128, European Patent Office, dated Oct. 14, 2020, 15 pages.
EP Intellectual Property Office, GB Application No. GB1910749.9, dated Jan. 22, 2020, 4 pages.

* cited by examiner

OPTOELECTRONIC SEMICONDUCTOR DEVICE

RELATED APPLICATIONS

This application is a 35 U.S.C. § 371 national phase application of PCT/EP2020/071128 (WO-2021/018832-A1), filed on Jul. 27, 2020, entitled "AN OPTOELECTRONIC SEMICONDUCTOR DEVICE," which application claims the benefit of GB 1910749.9 filed Jul. 26, 2019, both of which are incorporated herein by reference in its entirety.

FIELD OF THE INVENTION

One or more aspects of embodiments according to the present invention relate to semiconductor devices and their integration with waveguides and other devices to form optoelectronic integrated circuits, and a method of fabrication of the same.

BACKGROUND OF THE INVENTION

Lasers, particularly quantum lasers, have many well-documented uses in optoelectronic integrated circuit applications, such as being a crucial component of an optical interconnect, for example. As such, a laser's output power, reliability, linewidth and power efficiency are key performance metrics. For these reasons at least, quantum lasers are used as they exploit the benefits associated with quantum confinement of charge carriers (i.e. electrons and/or electron holes), such as yielding a desired gain spectrum or requiring a lower threshold current.

It is known in the field that group III/V compound semiconductor material lasers (hereafter referred to as group III/V lasers) are integrated to photonic integrated circuits (PIC) on silicon substrates. This is typically done using various known fabrication techniques, such as interfacing a gain chip with the PIC using butt coupling methods or by mechanically bonding the group III/V material to the silicon, for example. Problems associated with the known fabrication techniques are that they are costly due to the manipulation required to integrate group III/V dies onto the silicon chip, and also because most of the group III/V compound semiconductor material is removed in the integration process, which is further costly and wasteful.

Furthermore, amid all of the complex circuitry implemented on known silicon-based photonics and the possibilities offered by known silicon processing such as for CMOS circuits, the field of optoelectronics has also faced a big stumbling block: the lack of an integrated laser source. To date, silicon-photonics applications have had to rely on external laser sources that feed the optical chip through an optical fibre, on butt-coupled lasers or on die-bonding of laser diodes. A further problem is that none of those approaches are scalable to very large wafer volumes, low cost applications, or more complex laser designs.

For the previous-mentioned reasons at least, research in this technical field has focused on fully integrated laser diodes on silicon, both through wafer-bonding techniques that integrate direct-bandgap III/V epitaxial materials into prefabricated silicon circuits, and through direct epitaxy of III/V semiconductors on silicon. As a result, the inventors have observed a problem associated with the optoelectronic coupling of waveguides to high quality III/V gain layers (or gain materials) grown on silicon.

It is against this background that the inventions of the present application are formulated.

SUMMARY OF THE INVENTION

Accordingly, the present invention aims to solve the above problems by providing, according to one aspect of the invention, a semiconductor device for use in an optoelectronic integrated circuit, the device comprises: a group four (IV) substrate, a waveguide, and a group III/V multilayer stack. The group III/V multilayer stack comprises a quantum component for producing laser light for the waveguide, where the waveguide comprises a material with a deposition temperature below 550 degrees Celsius and a refractive index of any value between 1.3 and 3.8, and preferably between 1.44 and 3.8.

The chosen refractive index range of the waveguide of any value between 1.44 and 3.8 advantageously enables optical coupling of the laser light, produced by the quantum component and/or the group III/V multilayer stack (or the gain material), with the waveguide of the semiconductor device with a minimum insertion loss. For example, the chosen refractive index range may provide a low insertion loss of 3 dB/cm of the produced laser light in the waveguide, and/or may provide a wavelength range of the produced laser light in the waveguide between 850 nm and 2100 nm. The refractive index of the waveguide over the wavelength range produced by the laser may be between 1.44 and 3.8. The laser may produce light with a wavelength in the range of 850-2100 nm.

Advantageously, this wavelength range meets the specification required of standard group III/V lasers.

As the deposition temperature of the waveguide is below 550 degrees Celsius, it may further allow for a relatively lower formation and/or deposition temperature of the waveguide component when compared with known manufacturing techniques or known deposition temperatures of the group III/V multilayer stack. For example, during the manufacturing process, the waveguide may be deposited onto the semiconductor device at a relatively low temperatures when compared to the deposition temperature of, for example, the group III/V multilayer stack which typically has a relatively higher deposition temperature (e.g. around 650 degrees Celsius). As such, the deposition of the waveguide does not adversely affect the other components of the semiconductor device during the manufacturing processes, particularly the group III/V multilayer stack. This lower deposition temperature advantageously makes the manufacture of the device industrially feasible, and may also makes it easier to manipulate interfaces on the top layer of the semiconductor device.

Optional features of the invention will now be set out. These are applicable singly or in any combination with any aspect of the invention.

The quantum component may comprise at least one quantum dot (QD), quantum "dash", or quantum wire (QWR). The term quantum "dash" is used in the art when referring to an elongated QD. By using either quantum dashes or QWRs the invention advantageously is able to confine the electrons in two dimensions (2D). In addition, or alternatively, by using QDs the invention is advantageously able to further confine the electrons in three dimensions (3D).

It is known in the art that charge carriers in bulk semiconductors have zero-dimensional (0D) confinement. Consequently, such charge carriers can freely move in all the three spatial directions and behave as free particles with continuous energy levels and density of states (DOS). However, if any of the structural dimensions of the material are reduced to a dimension comparable to the de Broglie wavelength of the carrier or the exciton Bohr radius, the motion of the charge carriers becomes restricted in the corresponding direction, leading to the effect of quantum confinement, whereby the carrier energy levels and DOS are strongly related to the structural size, and are different from the bulk form.

It is also known in the art that quantum wells (QWs) are able to confine charge carriers in one-dimension, however by using either quantum dashes or QWRs the invention may advantageously further confine the charge carriers in two dimensions (2D). Alternatively, by using QDs, the invention may be able to further confine the charge carriers in three dimensions (3D). Quantum confinement of charge carriers in 2D and/or 3D is therefore advantageous as the energy levels and DOS can be tailored by controlling the structural size of the semiconductor material. As such, the electronic, electrical, optical and transport properties can be better engineered to meet the requirements of semiconductor devices and/or improve their working efficiency, such as requiring a relatively low threshold current, or tuning the emission wavelength of the laser, for example.

An advantage of using the quantum-level structures, such as QDs, quantum dashes, or QWRs, is that the energy levels and DOS can be tailored by controlling the structural size of semiconductors. As a result, the electronic, electrical, optical and transport properties can be better engineered to meet the requirements of devices or improve their efficiency.

The use of the quantum-level structures, such as QDs, quantum dashes, or QWRs is an important feature of the present invention, because a gain layer using these structures is less affected by dislocations in the semiconductor material than a gain layer composed of bulk semiconductor or quantum well layers. This is important, because when compound semiconductor layers are grown on Group IV materials, inevitable mismatches in crystal lattice constants between the compound semiconductor and Group IV materials generate significant numbers of dislocations, which can propagate into the gain layer.

The following materials may form the waveguide; silicon oxynitride (SiON), nitride-rich silicon nitride, stoichiometric silicon nitride, silicon-rich silicon nitride, amorphous silicon, glass (AL2O3), polymers, and/or conductive oxides.

The refractive index range of the waveguide may be dependent on the material that it is made from. As such, suitable materials used to form or deposit the waveguide may include the following; SiON and nitride-rich silicon nitride which have refractive indices ranging from 1.44 up to 2, stoichiometric silicon nitride which has a refractive index of approximately 2, silicon-rich silicon nitride which has a refractive index ranging from 2 up to 3.44, amorphous silicon which has a refractive index ranging from 3.2 up to 3.8, polymers which have refractive indices from 1.3 to 1.7, and glass (AL2O3) and/or conductive oxides which have refractive indices ranging from 1.6 to 1.8.

The waveguide may have a stepped or graded index. For example, a stepped (or step) index waveguide may comprise one or more layers of silicon nitride (SiN), each separated by an insulating layer of lower refractive index, for example an insulating layer of SiO2 or an insulating layer of SiN which has a lower refractive index (SiNx). When the device is in use, laser light may be optically coupled to at least one SiN layer (i.e. is able propagate as an electromagnetic wave within that SiN layer). This can induce (i.e. by an evanescent field) evanescent waves that propagate throughout the insulating layers of the device to reach other SiN layers. In turn, this further induces other evanescent waves (i.e. formed by subsequent evanescent fields) that further propagate through the device. In other words, the additional SiN layers provide an intermediate optical path for the laser light to propagate through. As such, the additional SiN layers effectively act as "stepping stones", allowing for intermediate laser light propagation, and producing resultant evanescent waves within the device in order to allow for shorter evanescent coupling interactions. Analogously, a graded index waveguide is formed of a material of continuously varied composition and hence has a refractive index that achieves a similar technical effect as that discussed for a step index waveguide, without requiring the intermediate insulating layers of SiO2 (as needed for the step index waveguide).

The step or graded index advantageously enables optoelectronic coupling of the laser light (as produced by the quantum component) with the waveguide by the formation of an evanescent wave within the waveguide itself, and/or by the propagation of an evanescent wave through the device. This optoelectronic coupling may also be referred to as evanescent coupling.

The semiconductor device may further comprise: a first insulating layer on the substrate, a silicon device layer on the first insulating layer, a second insulating layer on the silicon device layer, and the waveguide on the second insulating layer. The first and second insulating layers are also known as the cladding of the waveguide, whereas the silicon device layer is also known as the core waveguide of the device. The inclusion of the first and second insulating layers may advantageously enable the formation and/or propagation of an wave through the device. The first and second insulating layers may advantageously confine light within the silicon device layer, where at least the first insulating layer is sufficiently thin to enable efficient evanescent coupling of light from the waveguide to the silicon device layer. The first and second insulating layers may comprise silicon oxide.

The laser light produced by the quantum component may be optically coupled to the waveguide by a coupling structure between the waveguide and the silicon device layer. This coupling structure may advantageously facilitate the evanescent coupling of the produced laser light with the waveguide.

The coupling structure may be a tapered connection between the waveguide and the silicon device layer. In this coupling structure, one or more of the waveguides may be tapered. For example, in one embodiment a primary waveguide (e.g. made of SiN) may narrow in thickness or width, creating a taper. Alternatively, or additionally, a secondary silicon waveguide may also widen in thickness or width, also creating a taper. This relative tapering, or tapered connection, between the two waveguides encourages evanescent coupling of the laser light between them. In other words, this coupling structure may advantageously facilitate the evanescent coupling of the produced laser light with one or more of the waveguides which eases mode coupling.

The coupling structure may comprise one or more layers of silicon nitride inserted between the waveguide and the silicon device layer.

The silicon device layer may be a silicon waveguide. In this way, the silicon waveguide may advantageously be an additional waveguide of the semiconductor device.

The device may further comprise at least one anti-reflection coating located between the waveguide and the quantum component. For example, the at least one anti-reflection coating may allow for large proportion of the produced laser light to pass through, whilst permitting some reflection (e.g.

Fresnel reflections) of the laser light back into the quantum component. In this way, the at least one anti-reflection coating may advantageously create resonant frequency modes (e.g. within a resonant cavity of the quantum component) for optical amplification of the produced laser light. For example, the refractive index of the group III/V material may be approximately 3.3, which may be higher than the refractive index of the waveguide, causing a Fresnel reflection. As such, the anti-reflection coating may have an intermediate refractive index which reduces Fresnel reflections. Alternatively the index of the anti-reflection coating and its thickness may be adjusted to minimise reflection if required. Multiple anti-reflection layers may be used to enhance the bandwidth of operation. For example, using an anti-reflection coating with a material thickness of a quarter wavelength and having a refractive index which is the geometric mean of the refractive indices of the group III-V material and the waveguide, may result in no back reflections of the laser light.

The at least one anti-reflection coating may have a refractive index between the values of 1.44 to 3.2. This chosen refractive index range may optically match the refractive index of the waveguide with the refractive index of the gain material and/or the material of the quantum component. This matching of the refractive indices advantageously minimises reflections at the optical interface between a surface of anti-reflection coating and a surface of the quantum component.

The substrate may be a silicon substrate, a silicon-on-insulator (SOI) substrate layer, or SOI top layer. For example, the group III/V material may also be grown on a silicon over-layer of the SOI.

The group III/V multilayer stack may further comprise a nucleation layer located between the group III/V multilayer stack and the silicon substrate. In this way, the nucleation layer may be a seed layer for the high quality epitaxial growth of the gain material.

A mean thickness of the nucleation layer may be less than 100 nm. Preferably, the mean thickness of the nucleation layer may be less than 50 nm. The nucleation layer may be grown on the silicon substrate, where the nucleation layer is one of a gallium arsenide (GaAs) layer, an indium phosphide (InP) layer, or a gallium antimonide (GaSb) layer.

Optionally, an intermediate layer of germanium (Ge) may be sandwiched between the nucleation layer and the silicon substrate. For example, the intermediate Ge layer may be placed below the nucleation layer but above the silicon substrate. Alternatively, or additionally, a nucleation layer might be above the silicon substrate, but below the Ge intermediate layer.

In other alternative embodiments of the device of the present application, the nucleation layer may be grown on an intermediate layer of either gallium arsenide (GaAs), indium phosphide (InP), or gallium antimonide (GaSb). Alternatively, the intermediate layer may not be used at all and the nucleation layer and group III/V material is grown directly on the silicon substrate. The nucleation layer has, or may be formed with, a zinc blende crystal structure.

Optionally, the silicon substrate may be nanolithographically patterned prior to epitaxial growth.

According to another aspect of the invention, there is a method of manufacturing a semiconductor device for use in an optoelectronic integrated circuit. The method provides the device comprising: a group IV substrate and a group III/V multilayer stack, where the group III/V multilayer stack comprises a quantum component for producing laser light for the waveguide. The method further comprises depositing a waveguide using a deposition temperature below 550 degrees Celsius, where the waveguide has a refractive index of any value between 1.3 and 3.8, preferably between 1.44 and 3.8, and where the group III/V multilayer stack is optically coupled to the deposited waveguide.

The waveguide may be deposited or formed of one or more of the following materials; silicon oxynitride (SiON), nitride-rich silicon nitride, stoichiometric silicon nitride, silicon-rich silicon nitride, amorphous silicon, glass (AL2O3), polymers, and/or conductive oxides.

The group III/V multilayer stack may be formed on a nucleation layer located between the group III/V multilayer stack and the silicon substrate.

The group III/V multilayer stack may either be deposited directly onto a nucleation layer, or may be epitaxially grown from the nucleation layer to form a protruding slab.

The material used to form the waveguide is deposited on either side of the protruding slab, where the waveguide is formed on either side of at least the quantum component.

BRIEF DESCRIPTION OF THE DRAWINGS

Embodiments of the invention will now be described by way of example with reference to the accompanying drawings in which.

DETAILED DESCRIPTION AND FURTHER OPTIONAL FEATURES OF THE INVENTION

Figure 1:
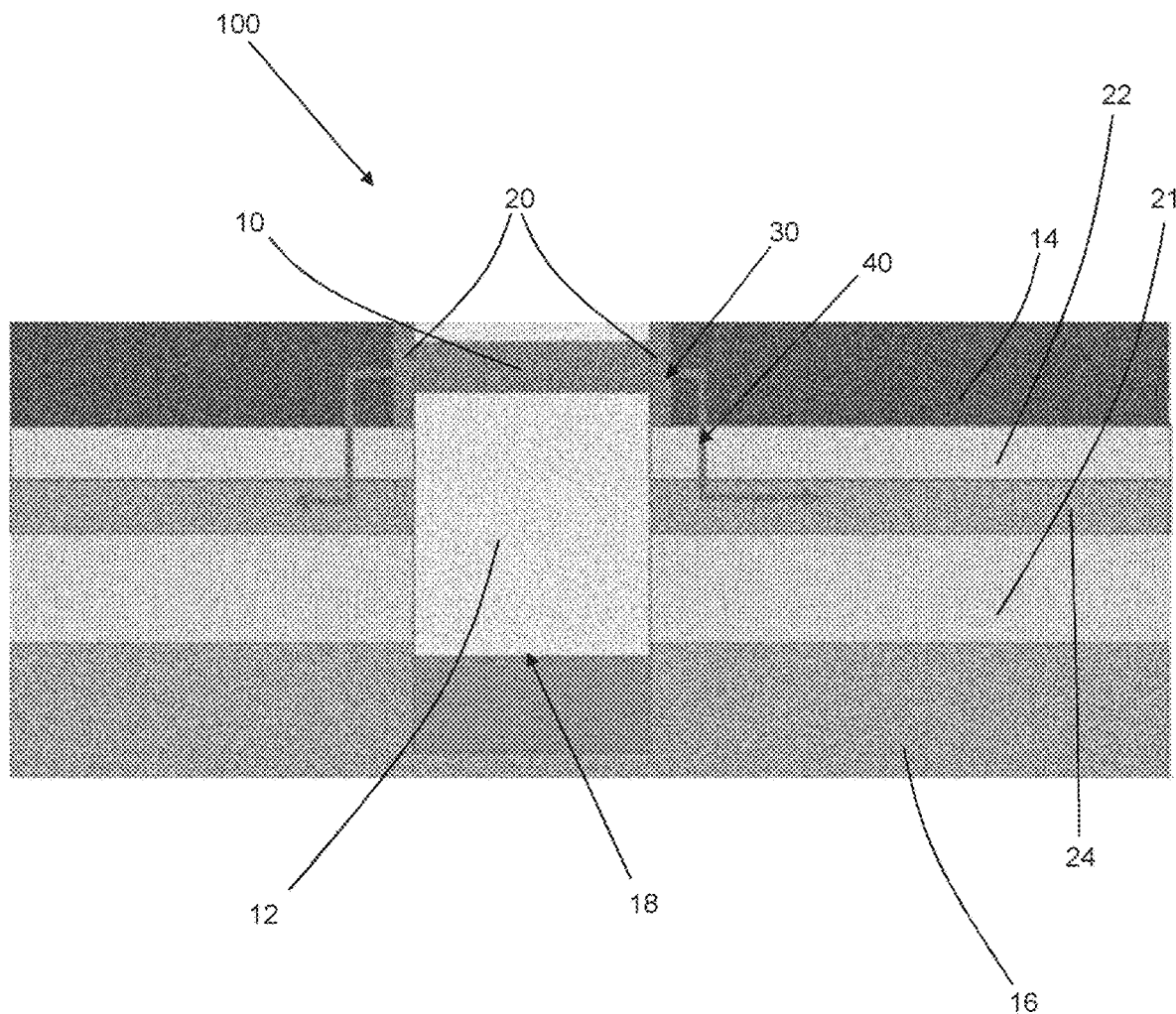
FIG. 1 is a cross-section side view of a semiconductor device according to an embodiment of the present invention.

FIG. 1 is a cross-sectional view showing a semiconductor device 100 for use in an optoelectronic integrated circuit, according to an embodiment of the present invention. The semiconductor device 100 is made from multiple internal layers that include at least a group IV substrate (or substrate layer) 16, a waveguide 14, and a group III/V multilayer stack 12.

The height of a device is measured in a direction away from the substrate 16. A top surface of a device is the surface that is farthest from the substrate 16 and a bottom surface of a device is the surface that is closest to the substrate 16. A width of a device is measured in a direction perpendicular to the height and perpendicular to the direction of propagation of light along the waveguide 14. A length of a device is measured in a direction perpendicular to the height and parallel to the direction of the propagation of light along the waveguide 14.

Referring to FIG. 1, the substrate 16 is located at the bottom surface of the device 100, whereas the waveguide 14 is located at the top surface of the device, such that FIG. 1 illustrates a cross-sectional side view of the device 100 showing the multiple internal layers. The device 100 further includes a first insulating layer 21 on the substrate 16, a silicon device layer 24 on the first insulating layer 21, a second insulating layer 22 on the silicon device layer 24, and the waveguide 14 on the second insulating layer 22. At the top surface of the device 100, the waveguide 14 interfaces with air, where the air forms an insulating or cladding region (not labelled in FIG. 1).

The group III/V multilayer stack 12 includes a nucleation layer 18 located between the group III/V multilayer stack 12 and the substrate 16. In this way, the nucleation layer is a seed layer for the epitaxial growth of the gain material. In an example embodiment, during the manufacturing process of the device 100, the substrate 16 has an etched region which defines a well or cavity. Alternatively, the group II/V multilayer stack 12 may be grown directly on the substrate 16 without requiring an etched well or cavity. The group III/V multilayer stack 12 is then either deposited directly onto the nucleation layer 18, or is epitaxially grown from the nucleation layer 18, vertically upwards away from the substrate 16, to form a protruding slab (not labelled in the figures). The protruding slab of the group III/V multilayer stack 12 includes a quantum component 10 for producing laser light for the waveguide 14 when the device 100 is in use.

The material used to form the waveguide 14 is deposited on either side of the protruding slab, such that the waveguide 14 is formed on either side of at least the quantum component 10. The waveguide 14 is formed by a material with a deposition temperature below 550 degrees Celsius and a refractive index of any value between 1.44 and 3.8. This chosen refractive index range of the waveguide 14 material advantageously enables optical coupling of the laser light, produced by the quantum component 10, and/or the group III/V multilayer stack 12 (or the gain material), with the waveguide 14 of the semiconductor device 100 with a minimum insertion loss.

For example, the chosen refractive index range can provide a low insertion loss of 3 dB/cm of the produced laser light in the waveguide 14, and/or provides a wavelength range of the produced laser light in the waveguide between 850 nm and 2100 nm. The refractive index of the waveguide over the wavelength range produced by the laser may be between 1.44 and 3.8. The laser may produce light with a wavelength in the range of 850-2100 nm. Advantageously, this wavelength range meets the specification required of standard group III/V lasers.

As the deposition temperature of the waveguide 14 is below 550 degrees Celsius, it further allows for a relatively lower formation and/or deposition temperature of the waveguide 14. For example, during the manufacturing process, the waveguide 14 is deposited onto the semiconductor device 100 at a relatively low temperature when compared to the deposition temperature of, for example, the group III/V multilayer stack 12 which typically has a relatively higher deposition temperature (e.g. around 650 degrees Celsius).

As such, the deposition of the waveguide 14 does not adversely affect the other components of the semiconductor device 100 during the manufacturing processes, particularly the group III/V multilayer stack 12. This lower deposition temperature advantageously makes the manufacture of the device 100 industrially feasible, and also makes it easier to manipulate interfaces on the top layer of the semiconductor device 100.

In an example embodiment of the device 100, there is at least one anti-reflection coating 20 sandwiched between one side of the waveguide 14 and one side of the quantum component 10. Optionally, there may be multiple anti-reflection coatings 20 sandwiched between one side of the waveguide 14 and one side of the quantum component 10 (also known as multi-layered anti-reflection coatings 20). In a preferred embodiment of the device 100, there are two anti-reflection coatings 20 sandwiched on either side of the protruding slab the group III/V multilayer stack 12 (as shown in FIG. 1). In this way, the two anti-reflection coatings 20 abut both opposite sides of the quantum component 10 and the waveguide 14. The anti-reflection coatings 20 are not essential to the operation of the device 100 and, in an alternative embodiment of the device 100 (not shown in any of the figures), there are no anti-reflection coatings 20 used.

The anti-reflection coatings 20 allow for large proportion of the produced laser light to pass through, whilst permitting some reflection of the laser light back into the quantum component 10. In this way, the anti-reflection coatings 20 can advantageously for some applications create resonant frequency modes (e.g. within a resonant cavity of the quantum component 10) for optical amplification of the produced laser light. Accordingly, both the anti-reflection coatings 20 can be tuned as desired.

In a preferred embodiment, the anti-reflection coatings 20 can have a refractive index between the values of 1.44 to 3.2. This chosen refractive index range can advantageously match the wavelength range of the produced laser light to minimise reflections at an optical interface 30 between a surface of anti-reflection coating 20 and the quantum component 10.

In an example embodiment, the quantum component is at least one of a quantum dot (QD), quantum dash, or quantum wire.

The refractive index range of the waveguide is dependent on the material that it is made or deposited from. As such, the following materials can be deposited to form the waveguide; silicon oxynitride (SiON), nitride-rich silicon nitride, stoichiometric silicon nitride, silicon-rich silicon nitride, amorphous silicon, glass (AL2O3), polymers, and/or conductive oxides. SiON and nitride-rich silicon nitride which have refractive indices ranging from 1.44 up to 2, stoichiometric silicon nitride has a refractive index of approximately 2, silicon-rich silicon nitride which has a refractive index ranging from 2 up to 3.44, amorphous silicon which has a refractive index ranging from 3.2 to 3.8, polymers which have refractive indices from 1.3 to 1.7 and glass (AL2O3) and/or conductive oxides which have refractive indices ranging from 1.6 to 1.8.

As the skilled person would appreciate, various other suitable materials not listed here may also be made be used to produce the waveguide 14 with a refractive index ranging from 3.2 to 3.8 (i.e. enabling a low loss waveguide to be formed) and are deposited at temperatures not affecting the gain layer (i.e. having a deposition temperature of less than 550 degrees Celsius). As such, the waveguide 14 material is not limited to the specific materials listed above.

In use, the group III/V multilayer stack 12 provides an optical amplification of the laser light produced by the quantum component 10, due to stimulated emission associated with photon emission created by the recombination of de-excited electrons and holes. As indicated by two staggered arrows illustrated in FIG. 1, the produced laser light is able to propagate from opposite sides of the quantum component 10, through the two anti-reflection coatings 20, and into the waveguide 14. As indicated by one of the staggered arrows, the laser light produced by the quantum component 10 is optically coupled, via the anti-reflection coating 20, with the waveguide 14 at the optical interface 30 (i.e. is able to propagate as an electromagnetic wave within waveguide 14). Once the laser light is optically coupled to the waveguide 14, it can also induce (i.e. by evanescent coupling) an evanescent wave 40 that propagates through the device 100 into other layers other than the waveguide 14, such as the lower waveguide layer 24, for example.

The inclusion of at least the first 21 and second 22 insulating layers in the semiconductor device 100 advantageously enables evanescent coupling by the formation and/or propagation of the evanescent wave 40 from the waveguide 14, through the device 100, and into other layers lower than the waveguide 14. The first 21 and second 22 insulating layers may advantageously confine light within the silicon device layer 24 (i.e. the core waveguide of the device), where at least the first insulating layer 21 may be sufficiently thin to allow efficient evanescent coupling of light from the waveguide 14 to the silicon device layer 24. In an example embodiment, during evanescent coupling, the evanescent wave 40 is shown to propagate into the silicon device layer 24 (i.e. as shown by the two staggered arrows in FIG. 1), however the evanescent wave 40 is not limited to this particular propagation route, and may instead (or additionally) propagate into other layers within the device 100, as is described in the following paragraphs.

In an alternative embodiment (not shown in the figures), the produced laser light propagates from only one side of the quantum component 10, through only one anti-reflection coating 20, into the waveguide 14. This may occur when, instead of there being two anti-reflection coatings 20 located on either side of the quantum component 10 (as shown in the figures), there is only one anti-reflection coating 20 located on one side. For example, in place of the other anti-reflection coating 20 there may instead by an insulating material, such as SiO2. In this way, the insulating material may prevent optically coupling of the laser light with the waveguide 14 on that particular side of the quantum component 10. This forces the laser light to propagate through only one side of quantum component 10 i.e. at the interface with the single anti-reflection coating 20.

In an alternative embodiment (also not shown in the figures), there are no anti-reflection coatings 20 used, and the produced laser light propagates directly from the quantum component 10 into the waveguide 14. The anti-reflection coatings 20 may only be necessary in cases where the refractive index value of the material in the group III/V multilayer stack 12 and the refractive index value of the waveguide 14 material are not optically matched.

In an alternative embodiment (also not shown in the figures) the lower waveguide 24 is not present and light propagates through the upper waveguide core without the use of evanescent coupling to a lower waveguide 24.

Figure 2:
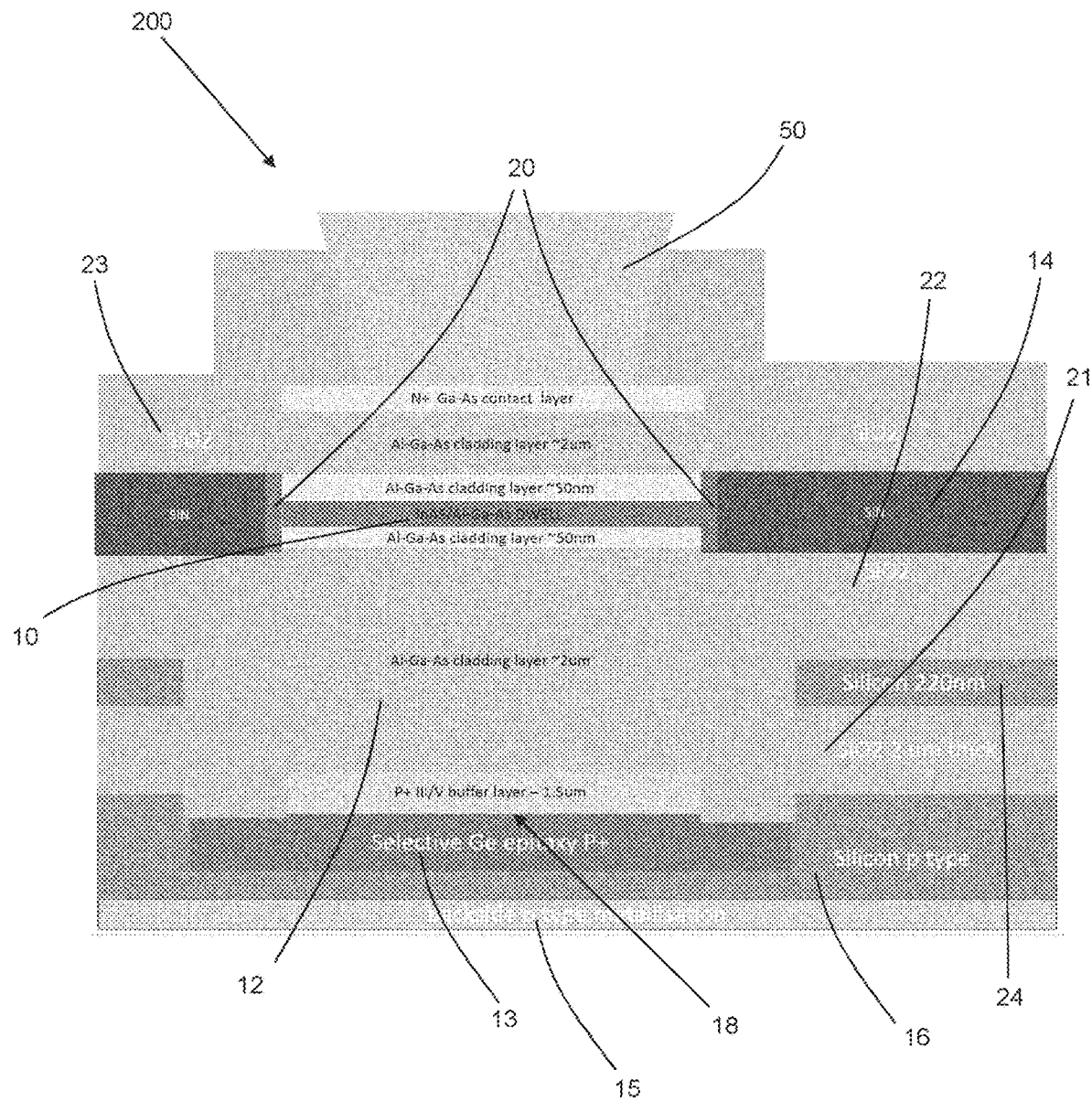
FIG. 2 is a cross-sectional view of a semiconductor device according to another embodiment of the present invention.

FIG. 2 is a cross-sectional view of a semiconductor device 200 according to another embodiment of the present invention. Referring to FIG. 2, the first 21 and second 22 insulating layers both comprise silicon oxide (SiO2). As the skilled person would appreciate, in other embodiments the insulating layers may comprise other materials. The device 200 further includes an electrical contact layer 50 on the group III/V multilayer stack 12. The device 200 also includes a third insulating layer 23, also comprising SiO2 or some other insulating material advantageously with a refractive index less than that of waveguide 14, which covers the waveguide 14 and abuts the contact layer 50 on either side to form the top layer of the device 200. In this way, the third insulating layer 23, at least partially, covers the group III/V multilayer stack 12.

In the embodiment shown in FIG. 2, the connection between both sides of the contact layer 50 and the third insulating layer 23 is shown as a tapered-fit connection, however the skilled person would appreciate that any suitably shaped connection (e.g. non-tapered) would also suffice. The inclusion of the third insulating layer 23 is used to provide electrical insulation between parts of the device other than the group III/V multilayer stack 12 and the contact layer 50. The third insulating layer 23 is optional.

Referring to FIG. 2, the group III/V multilayer stack 12 is deposited on the substrate layer 16 either uniformly or selectively on photolithographically patterned wafers and the stack, by way of example includes the following order of layers, starting from bottom layer to top layer:

a p-type (P+) doped group III/V buffer layer of approximately 1.5 microns in thickness, a first aluminium gallium arsenide (Al—Ga—As) cladding layer of approximately 2 microns in thickness, a first Al—Ga—As cladding layer of approximately 50 nm in thickness, a quantum component 10 in the form of a quantum dot-in well (DWELL) formed of indium arsenide (In As) or Al—Ga—As, a second Al—Ga—As cladding layer of approximately 50 nm in thickness, a second Al—Ga—As cladding layer of approximately 50 nm in thickness, and an n-type (N+) Ga—As contact layer.

As the skilled person would appreciate, various changes may be made to the thicknesses of the group III/V multilayer stack 12 layers, and the layers (or combination of layers) are therefore not limited to the specific thicknesses or order listed above.

In the embodiment of the device 200 shown in FIG. 2, the substrate layer 16 is formed of p-type silicon. A metallic contact layer 15 is deposited on the underside of the substrate layer 16 and forms the bottom surface of a device 200. The nucleation layer 18 is epitaxially grown on an intermediate layer 13, and the intermediate layer 13 is itself grown on the substrate layer 16. Referring to FIG. 2, the intermediate layer 13 may be formed of p-type (P+) doped germanium (Ge). In another alternative embodiment of the device of the present application (not shown in any of the figures), the nucleation layer 18 is grown on an intermediate layer 13 of either gallium arsenide (GaAs), indium phosphide (InP), or gallium antimonide (GaSb). At least the first insulating (SiO2) layer 21 is (approximately) 2 microns thick, and the silicon device layer 24 is 220 nm in thickness. In one preferred embodiment of the device 200, a mean thickness of the nucleation layer 18 is less than 100 nm. In another preferred embodiment, the mean thickness of the nucleation layer 18 is less than 50 nm. The use of the intermediate layer 13 (as shown in FIGS. 2 to 5) is optional, and in an alternative embodiment of the invention (not shown in the figures), the intermediate layer 13 may not be used at all, and the group III/V multiplayer stack 12 is instead grown directly on the silicon substrate 16. In another embodiment of the invention, the doping of the layers of the group III/V multilayer stack 12 may be reversed or reordered. For example, the doping of the layers may be reversed so that the upper contact is to P+ material and the lower contact to N+ material. In a further embodiment of the invention, there may be no metallic contact layer 15 required, particularly if the substrate 16 comprises semi-insulating silicon, and a contact to the lower buffer layer (of the group III/V multilayer stack 12) from the top of the device is introduced.

As the skilled person would further appreciate, various changes may be made to the types and thicknesses of the substrate, nucleation, and insulating layers. As such, the devices of the present invention are not limited to the specific configuration (e.g. layer type, order, or thicknesses) identified here.

Referring to the embodiment shown in FIG. 2, the silicon device layer 24 is not in direct contact with the group III/V multilayer stack 12 layer, and is instead separated from the group III/V multilayer stack 12 layer by an insulating material, such as a silicon oxide (SiO2) bulk region located on either side of the group III/V multilayer stack 12.

Figure 3:
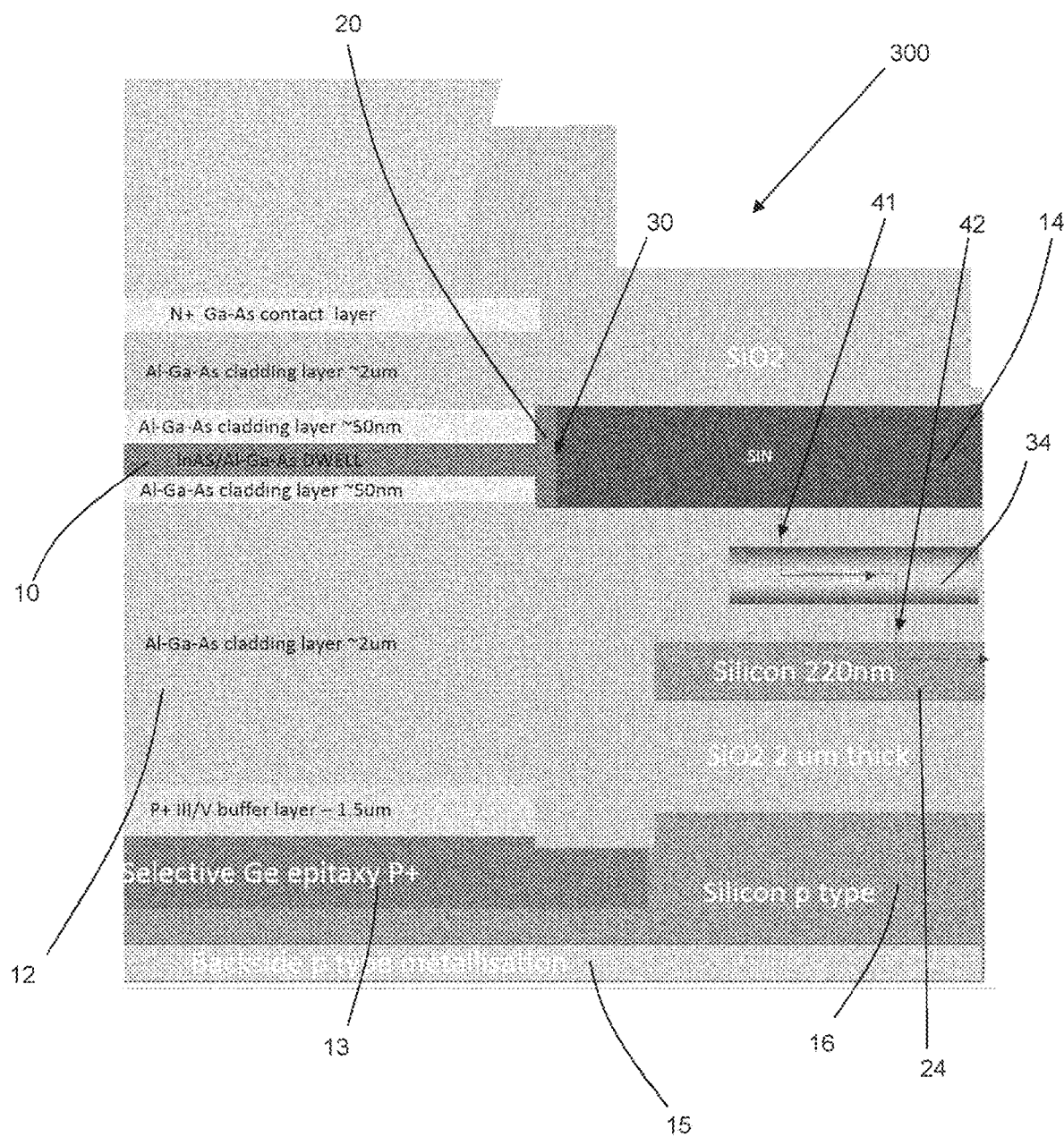
FIG. 3 is a cross-sectional view of one side of a semiconductor device according to another embodiment of the present invention.

FIG. 3 shows a cross-sectional view of one side of a semiconductor device 300 according to an embodiment of the present invention, where the left side of the device 300 is not visible. In this embodiment, the device 300 includes an additional silicon nitride layer 34 (SiN) inserted between the waveguide 14 and the silicon device layer 24. In an example embodiment, the additional silicon nitride layer 34 is sandwiched between two insulating layers, which are preferably layers of silicon oxide (SiO2), located between the waveguide 14 and the silicon device layer 24.

Referring to FIG. 3, when the device 300 is in use, the laser light produced by the quantum component 10 is optically coupled, via the anti-reflection coating 20, with the waveguide 14 at the optical interface 30. As indicated by the staggered arrows, once the laser light is optically coupled to the waveguide 14, it can also induce (i.e. by an evanescent field) a first evanescent wave 41 that propagates through the device 300 into the SiN layer 34. At this point, the laser light is additionally optically coupled to the SiN layer 34 (i.e. is also able propagate as an electromagnetic wave within the SiN layer 34). After which, it can also induce (i.e. by an evanescent field) a second evanescent wave 42 that propagates through the device 300 into the silicon device layer 24. In other words, the additional SiN layer 34 provides an intermediate optical path for the laser light to propagate through, when travelling between the waveguide 14 and the silicon device layer 24. As such, the additional SiN layer 34 is effectively a "stepping stone" for allowing intermediate laser light propagation, and producing resultant evanescent waves (e.g. the first 41 and second 42 evanescent waves), within the device 300 in order to allow for shorter evanescent coupling interactions.

Referring to FIGS. 1 to 3, the single waveguide is a full index waveguide 14. In another example embodiment of the present invention, the silicon device layer 24 is a silicon waveguide 24. In this way, the silicon waveguide 24 is advantageously an additional (or a secondary) waveguide belonging to the semiconductor device i.e. in addition to the (primary) full index waveguide 14.

Figure 4:
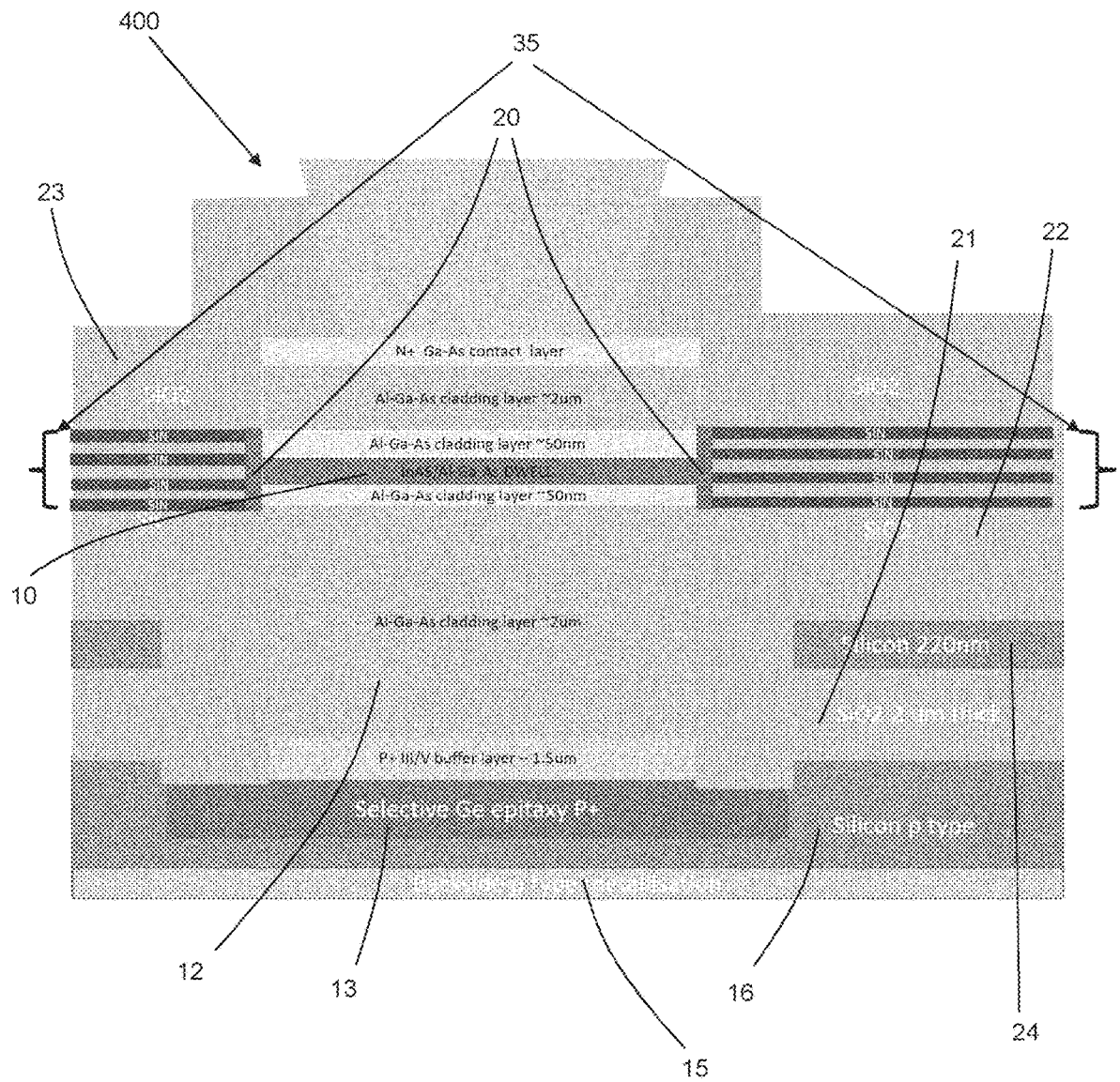
FIG. 4 is a cross-sectional view of a semiconductor device according to another embodiment of the present invention.

FIG. 4 shows a cross-sectional view of a semiconductor device 400 according to an embodiment of the present invention, whereby the device 400 comprises a plurality of layers 35 of silicon nitride (SiN). In an example embodiment, the one or more layers of silicon nitride 35 are each separated by an insulating layer, preferably a layer of silicon oxide. In the example embodiment shown in FIG. 4, there are four SiN layers 35 inserted between the third insulating layer 23 and the second insulating layer 22. Each SiN layer is separated by a thin silicon oxide layer (SiO2). In other embodiments, the SiO2 layers may be replaced by layers of other insulating materials. As the skilled person would appreciate, FIG. 4 is only illustrative of a particular embodiment of the present invention. As such, the device 400 is not limited to the particular configuration shown in FIG. 4 and may include one or more SiN layers 35 and/or SiO2 layers.

Analogous to the previously discussed technical effect of using only one additional SiN layer, evanescent coupling can also be advantageously optimised by using more than one SiN layer. As such, the multiple layers of SiN are effectively multiple "stepping stones" for allowing multiple intermediate laser light propagations, and producing resultant evanescent waves (not shown in FIG. 4), within the device 400. This can enable even shorter evanescent coupling interactions, thereby allowing evanescent waves to propagate further within the device 400 into the silicon waveguide 24, than in device 300. In this embodiment, the one or more layers 35 of SiN of the device 400 are collectively referred to as a step index waveguide 35.

Figure 5:
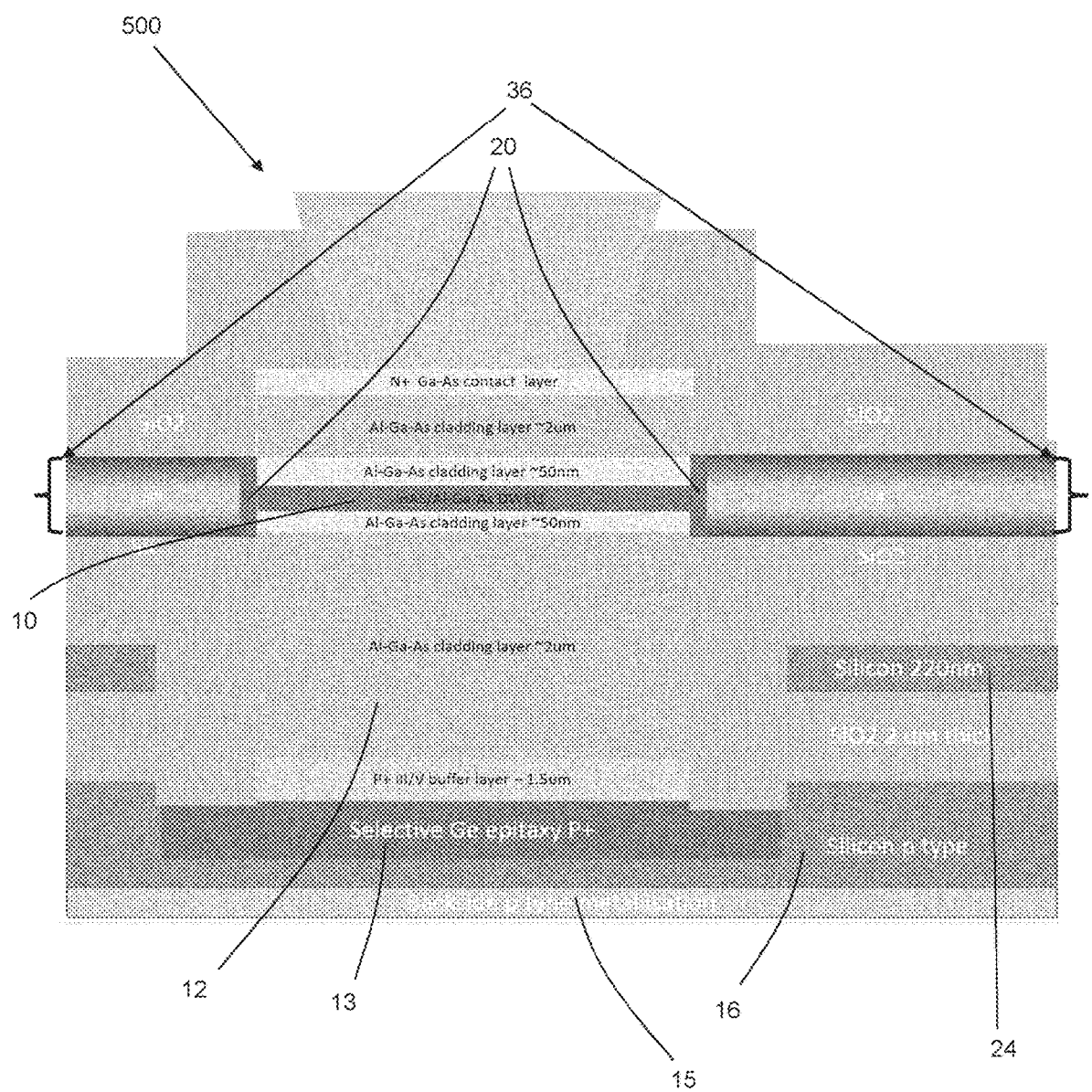
FIG. 5 shows a cross-sectional view of a semiconductor device according to another embodiment of the present invention.

FIG. 5 shows a cross-sectional view of a semiconductor device 500 according to an embodiment of the present invention, whereby the device 500 includes a graded index waveguide 36 in place of the step index waveguide 35 used in the embodiment shown in FIG. 4.

Referring to both FIGS. 4 and 5, the step index waveguide 35 (as shown in FIG. 4) and the graded index waveguide 36 (as shown in FIG. 5) both advantageously enable optoelectronic coupling of the laser light (as produced by the quantum component 10) with the silicon waveguide 24 by the formation of evanescent waves within the waveguide itself, and/or by the propagation of an evanescent waves through device. These coupling structures therefore advantageously facilitate the evanescent coupling of the produced laser light with the silicon waveguide 24.

Figure 6:
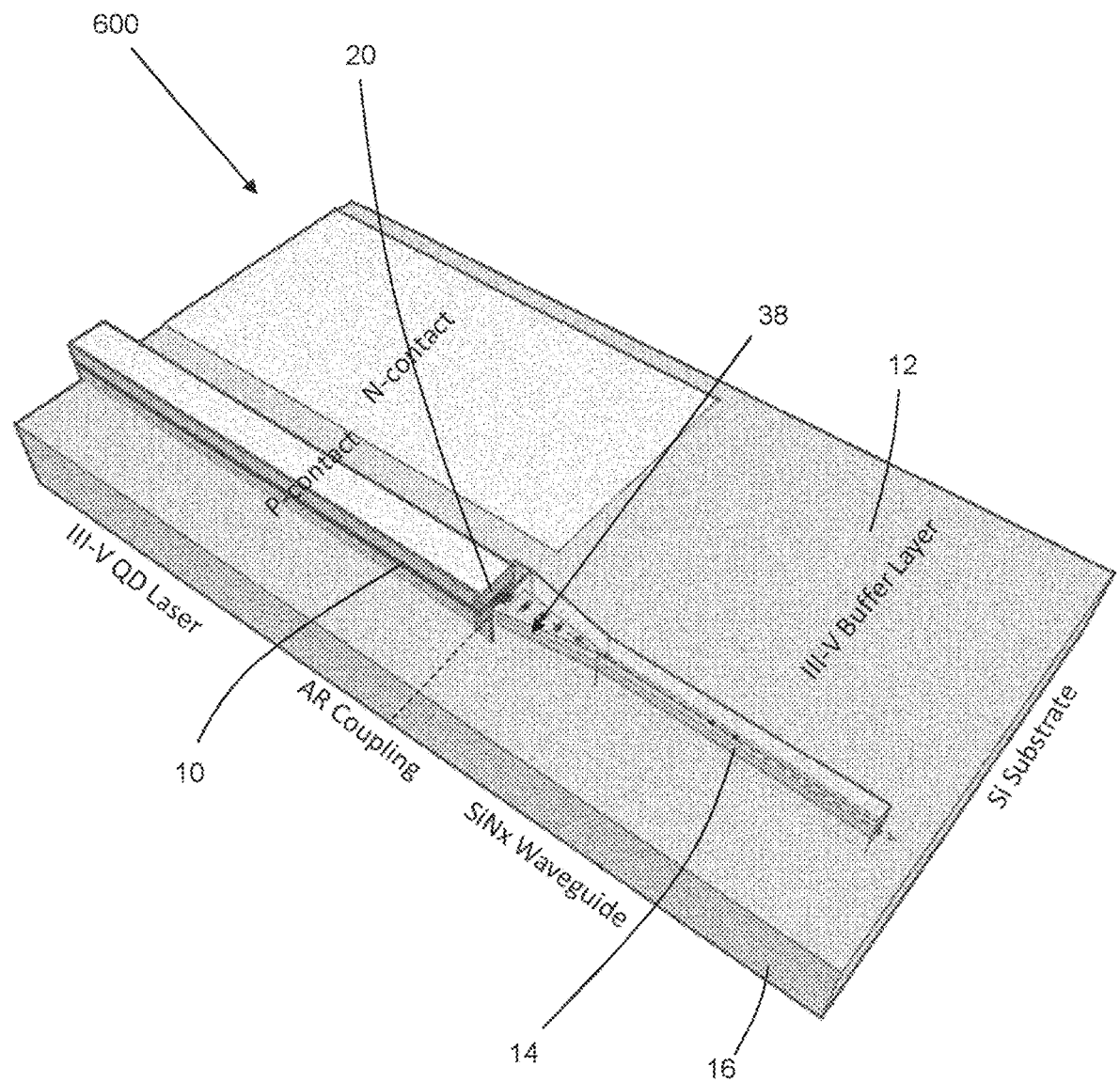
FIG. 6 is an isometric schematic view of a semiconductor device according to another embodiment of the present invention.

FIG. 6 is an isometric schematic view of a semiconductor device 600 according to another embodiment of the present invention. Referring to FIG. 6, the laser light produced by the quantum component 10 is coupled to the waveguide 14 by a coupling structure. The coupling structure is a tapered connection 38 between the waveguide 14 and the anti-refection coating 20. In this coupling structure, one or more of the waveguides (i.e. the primary waveguide 14 and the secondary silicon waveguide 24) may be tapered. For example, in one embodiment the primary waveguide 14 (e.g. made of SiN) may narrow in thickness or width, creating the tapered connection 38 (as shown in FIG. 6). This tapered connection 38 encourages optical coupling of the laser light produced by the quantum component 10, through the anti-refection coating 20, to the waveguide 14.

Alternatively, or additionally, the secondary silicon waveguide 24 may also widen in thickness or width, also creating a taper. This relative tapering, or tapered connection, between the two waveguides (not shown in the figures) may encourage evanescent coupling of the laser light between them. In other words, this coupling structure may advantageously facilitate the evanescent coupling of the produced laser light with one or more of the waveguides which eases mode coupling.

In an alternative embodiment of the device of the present application (not shown in the figures), the nucleation layer 18 is formed with a zinc blende crystal structure.

In a further alternative embodiment of the device the waveguide layer 24 is composed of SiN or some other material having a refractive index greater than that of the first 21 and second 22 insulating layers.

In yet a further example embodiment of the device of the present application, the substrate 16 is a silicon substrate (as shown in FIG. 1), a silicon-on-insulator (SOI) substrate layer 16 (as shown in FIGS. 2 to 5), or SOI top layer (not shown in any of the figures)

According to another aspect of the invention, there is a method of manufacturing a semiconductor device for use in an optoelectronic integrated circuit. The method provides the device comprising: a group IV substrate 16, and a group III/V multilayer stack 12, where the group III/V multilayer stack 12 comprises a quantum component 10 for producing laser light for the waveguide 14. The method of manufacture further comprises depositing a waveguide 14 using a deposition temperature below 550 degrees Celsius, and where the waveguide 14 has a refractive index of any value between 1.3 and 3.8, preferably between 1.44 and 3.8, and where the group III/V multilayer stack 12 is optically coupled to the deposited waveguide 14.

The waveguide 14 may be deposited or formed of one or more of the following materials; silicon oxynitride (SiON), nitride-rich silicon nitride, stoichiometric silicon nitride, silicon-rich silicon nitride, amorphous silicon, glass (AL2O3), polymers and/or conductive oxides.

The group III/V multilayer stack 12 is formed on a nucleation layer 18 located between the group III/V multilayer stack 12 and the silicon substrate 16.

The group III/V multilayer stack 12 is either deposited directly onto a nucleation layer 18, or epitaxially grown from the nucleation layer 18 to form a protruding slab.

The material used to form the waveguide 14 is deposited on either side of the protruding slab, where the waveguide 14 is formed on either side of at least the quantum component 10.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

All references referred to above are hereby incorporated by reference.

The invention claimed is:

1. A semiconductor device for use in an optoelectronic integrated circuit;
    the device comprising:
        a group IV substrate, wherein the substrate is a silicon substrate, a SOI substrate, or a SOI top layer;
        a waveguide;
        a group III/V multilayer stack; and
        a nucleation layer located between the group III/V multilayer stack and the substrate, wherein the nucleation layer has a zincblende structure;
    wherein the group III/V multilayer stack comprises a quantum component for producing light for the waveguide;
    wherein the waveguide comprises a material with a deposition temperature below 550 degrees Celsius and a refractive index of any value between 1.3 and 3.8.

2. The semiconductor device of claim 1, wherein the quantum component comprises at least one quantum dot, quantum dash, or quantum wire.

3. The semiconductor device of claim 1, wherein the waveguide comprises one or more of; silicon oxynitride (SiON), nitride-rich silicon nitride, stoichiometric silicon nitride, silicon-rich silicon nitride, amorphous silicon, glass (AL2O3), polymers, and/or conductive oxides.

4. The semiconductor device of claim 1, wherein the waveguide has a stepped or graded index.

5. The semiconductor device of claim 1, wherein the device further comprises:
    a first insulating layer on the substrate,
    a silicon device layer on the first insulating layer,
    a second insulating layer on the silicon device layer, and
    the waveguide on the second insulating layer.

6. The semiconductor device of claim 5, wherein the first and second insulating layers comprise silicon oxide.

7. The semiconductor device of claim 5, wherein the quantum component is optically coupled to the waveguide by a coupling structure between the waveguide and the silicon device layer.

8. The semiconductor device of claim 7, wherein the coupling structure is a tapered connection between the waveguide and the silicon device layer.

9. The semiconductor device of claim 7, wherein the coupling structure comprises one or more layers of silicon nitride inserted between the waveguide and the silicon device layer.

10. The semiconductor device of claim 5, wherein the silicon device layer is a silicon waveguide.

11. The semiconductor device of claim 1, wherein the device further comprises at least one anti-reflection coating located between the waveguide and the quantum component.

12. The semiconductor device of claim 11, wherein the at least one anti-reflection coating has a refractive index between the values of 1.44 to 3.2.

13. A method of manufacturing a semiconductor device for use in an optoelectronic integrated circuit comprising:
    providing a device comprising:
        a group IV substrate, wherein the substrate is a silicon substrate, a SOI substrate, or a SOI top layer;
        a group III/V multilayer stack; and
        a nucleation layer located between the group III/V multilayer stack and the substrate, wherein the nucleation layer has a zincblende structure;
        wherein the group III/V multilayer stack comprises a quantum component for producing light for the waveguide; and
    depositing a waveguide using a deposition temperature below 550 degrees Celsius;
    wherein the waveguide has a refractive index of any value between 1.3 and 3.8;
    wherein the group III/V multilayer stack is optically coupled to the deposited waveguide.

14. The method according to claim 13, wherein the waveguide is deposited or formed of one or more of the following materials; silicon oxynitride (SiON), nitride-rich silicon nitride, stoichiometric silicon nitride, silicon-rich silicon nitride, amorphous silicon, glass (AL2O3), polymer, and/or conductive oxides.

15. The method of claim 14, wherein the group III/V multilayer stack is formed on the nucleation layer located between the group III/V multilayer stack and the silicon substrate.

16. The method according to claim 15, wherein the group III/V multilayer stack is either deposited directly onto the nucleation layer, or is epitaxially grown from the nucleation layer to form a protruding slab.

17. The method according to claim 16, wherein the material used to form the waveguide is deposited on either side of the protruding slab, wherein the waveguide is formed on either side of at least the quantum component.

* * * * *